United States Patent
Deguchi

(10) Patent No.: US 7,428,480 B2
(45) Date of Patent: Sep. 23, 2008

(54) CAD ANALYSIS RESULT DATA PROCESSING APPARATUS, ANALYTIC SIMULATION APPARATUS, CAD ANALYSIS RESULT DATA PROCESSING METHOD AND CAD ANALYSIS RESULT DATA PROCESSING PROGRAM

(75) Inventor: Masahira Deguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 595 days.

(21) Appl. No.: 10/269,987

(22) Filed: Oct. 15, 2002

(65) Prior Publication Data

US 2003/0187625 A1 Oct. 2, 2003

(30) Foreign Application Priority Data

Mar. 28, 2002 (JP) ............................. 2002-090141

(51) Int. Cl.
 *G06G 7/48* (2006.01)
(52) U.S. Cl. .......................................... 703/6; 345/419
(58) Field of Classification Search ............. 703/6; 345/419, 418
See application file for complete search history.

(56) References Cited

U.S. PATENT DOCUMENTS 5,701,403 A * 12/1997 Watanabe et al. ........... 345/419
7,054,800 B2 * 5/2006 Wakabayashi et al. ......... 703/7

FOREIGN PATENT DOCUMENTS

| JP | 03-271871 | | 12/1991 |
|---|---|---|---|
| JP | 05-203466 | | 8/1993 |
| JP | 7-210584 | | 8/1995 |
| JP | 10031759 A | * | 2/1998 |
| JP | 11066131 A | * | 3/1999 |
| JP | 11-195054 | | 7/1999 |

OTHER PUBLICATIONS

Spyrakos, Constantine et al. "Linear and Nonlinear Finite Element Analysis in Engineering Practice." 1997, Algor, Inc. Chapter 6, pp. 213-238.*
"AutoCAD 2002: DXF Reference Guide." pp. 173-174. Copyright 2001 Autodesk, Inc.*
Cirak, Fehmi et al. "Integrated Modeling, Finite-Element Analysis, and Engineering Design for Thin-Shell Structures using Subdivision." Elsevier 2001.*
Office Action issued in corresponding Japanese Patent Application No. 2002-090141, on Jun. 26, 2007, 1 Page.

* cited by examiner

*Primary Examiner*—Russell Frejd
(74) *Attorney, Agent, or Firm*—Staas & Halsey LLP

(57) ABSTRACT

A CAD analysis result data processing apparatus having analysis result data obtaining part for obtaining analysis result data of analytic simulation for dividing an object having a three-dimensional form into a plurality of elements and performing an analysis of a predetermined physical quantity; extracting part for, based on the analysis result data obtained by the analysis result data obtaining part, extracting surfaces constituting an outside form of the object from the surfaces constituting the plurality of elements; and coordinate obtaining part for, based on the analysis result data obtained by the analysis result data obtaining part, obtaining coordinates of the object after deformation by the analytic simulation for nodes constituting the surfaces extracted by the extracting part is provided.

13 Claims, 14 Drawing Sheets

FIG. 5(a)
CAD model
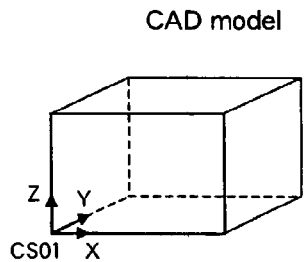
FIG. 5(b)
Analysis model
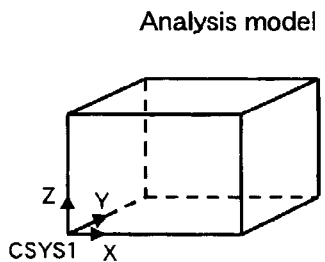
FIG. 5(d)
Preview
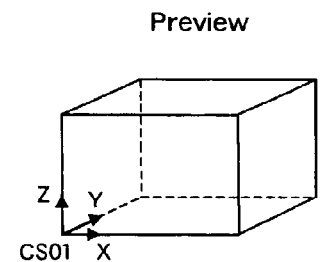
FIG. 5(c)
```
CAD model coordinate system      : CS01
Analysis model coordinate system : CSYS1
Translation      X axis : 0       Rotation    X axis : 0
                 Y axis : 0                   Y axis : 0
                 Z axis : 0                   Z axis : 0
```
FIG.6(a)
CAD model
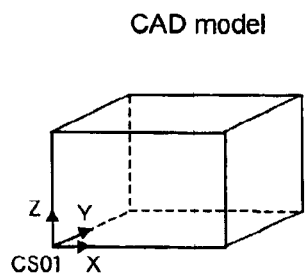
FIG.6(b)
Analysis model
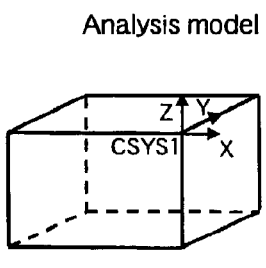
FIG.6(d)
Preview
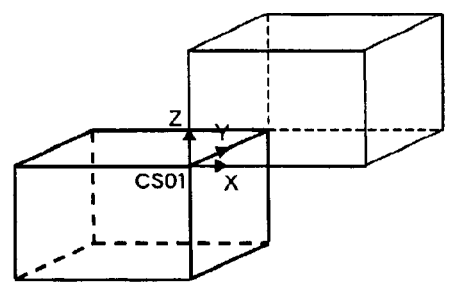
FIG.6(c)
```
CAD model coordinate system      : CS01
Analysis model coordinate system : CSYS1
Translation      X axis : + width     Rotation    X axis : 0
                 Y axis : 0                       Y axis : 0
                 Z axis : + height                Z axis : 0
```

FIG.7(a)
CAD model
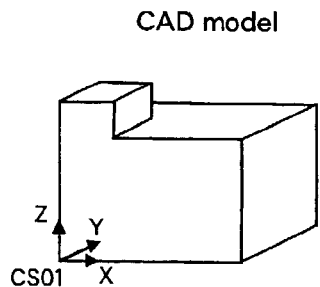
FIG.7(b)
Analysis model
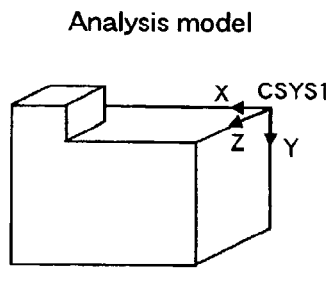
FIG.7(d)
Preview
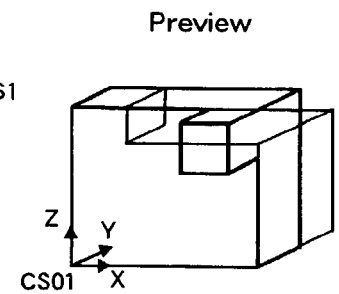
FIG.7(c)
CAD model coordinate system    : CS01
Analysis model coordinate system : CSYS1
Translation    X axis : +width      Rotation    X axis : −90
               Y axis : +depth                  Y axis : 0
               Z axis : +height                 Z axis : 180
FIG.8
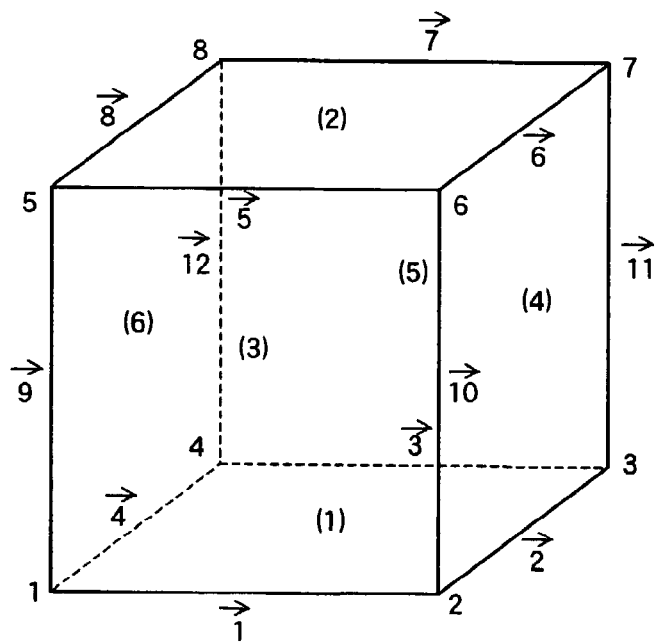

Element definition

| Element ① | 1 | 2 | 5 | 4 | 10 | 11 | 14 | 13 |
|---|---|---|---|---|---|---|---|---|
| Element ② | 2 | 3 | 6 | 5 | 11 | 12 | 15 | 14 |
| Element ③ | 4 | 5 | 8 | 7 | 13 | 14 | 17 | 16 |
| Element ④ | 5 | 6 | 9 | 8 | 14 | 15 | 18 | 17 |
| Element ⑤ | 2 | 3 | 6 | 5 | 19 | 20 | 23 | 22 |
| Element ⑥ | 11 | 12 | 15 | 14 | 20 | 21 | 24 | 23 |
| Element ⑦ | 13 | 14 | 17 | 16 | 22 | 23 | 26 | 25 |
| Element ⑧ | 14 | 15 | 18 | 17 | 23 | 24 | 27 | 26 |

FIG.13

Surface information on element <1>

| Surface number | Constituting node 1 | Constituting node 2 | Constituting node 3 | Constituting node 4 | Other than subject |
|---|---|---|---|---|---|
| Surface 1 | 1 | 2 | 5 | 4 | |
| Surface 2 | 10 | 11 | 14 | 13 | |
| Surface 3 | 1 | 2 | 11 | 10 | |
| Surface 4 | 2 | 5 | 14 | 11 | 1 |
| Surface 5 | 5 | 4 | 13 | 14 | |
| Surface 6 | 4 | 1 | 10 | 13 | |

FIG.14

Surface information on element <2>

| Surface number | Constituting node 1 | Constituting node 2 | Constituting node 3 | Constituting node 4 | Other than subject |
|---|---|---|---|---|---|
| Surface 1 | 2 | 3 | 6 | 5 | |
| Surface 2 | 11 | 12 | 15 | 14 | |
| Surface 3 | 2 | 3 | 12 | 11 | |
| Surface 4 | 3 | 6 | 15 | 12 | |
| Surface 5 | 6 | 5 | 14 | 15 | |
| Surface 6 | 5 | 2 | 11 | 14 | 1 |

FIG.15

| Surface number | Surface number | Constituting node 1 | Constituting node 2 | Constituting node 3 | Constituting node 4 |
|---|---|---|---|---|---|
| 1 | 1 | 1 | 2 | 5 | 4 |
| 1 | 3 | 1 | 2 | 11 | 10 |
| 1 | 6 | 4 | 1 | 10 | 13 |
| 2 | 1 | 2 | 3 | 6 | 5 |
| 2 | 3 | 2 | 3 | 12 | 11 |
| 2 | 4 | 3 | 6 | 13 | 12 |
| 3 | 1 | 4 | 5 | 8 | 7 |
| 3 | 5 | 8 | 7 | 16 | 17 |
| 3 | 6 | 7 | 4 | 13 | 16 |
| 4 | 1 | 5 | 6 | 9 | 8 |
| 4 | 4 | 6 | 9 | 18 | 15 |
| 4 | 5 | 9 | 7 | 17 | 18 |
| 5 | 2 | 19 | 20 | 23 | 22 |
| 5 | 3 | 10 | 11 | 20 | 19 |
| 5 | 6 | 13 | 10 | 19 | 22 |
| 6 | 2 | 20 | 21 | 24 | 23 |
| 6 | 3 | 11 | 12 | 21 | 20 |
| 6 | 4 | 12 | 15 | 24 | 21 |
| 7 | 2 | 22 | 23 | 26 | 25 |
| 7 | 5 | 17 | 16 | 25 | 26 |
| 7 | 6 | 16 | 13 | 22 | 25 |
| 8 | 2 | 23 | 24 | 27 | 26 |
| 8 | 4 | 15 | 18 | 27 | 24 |
| 8 | 5 | 18 | 17 | 26 | 27 |

FIG.16

| Node number | Post-deformation X coordinate | Post-deformation Y coordinate | Post-deformation Z coordinate |
|---|---|---|---|
| 1 | xxx.xx | xxx.xx | xxx.xx |
| 2 | xxx.xx | xxx.xx | xxx.xx |
| 3 | xxx.xx | xxx.xx | xxx.xx |
| 4 | xxx.xx | xxx.xx | xxx.xx |
| 5 | xxx.xx | xxx.xx | xxx.xx |
| 6 | xxx.xx | xxx.xx | xxx.xx |
| 7 | xxx.xx | xxx.xx | xxx.xx |
| 8 | xxx.xx | xxx.xx | xxx.xx |
| 9 | xxx.xx | xxx.xx | xxx.xx |
| 10 | xxx.xx | xxx.xx | xxx.xx |
| 11 | xxx.xx | xxx.xx | xxx.xx |
| 12 | xxx.xx | xxx.xx | xxx.xx |
| 13 | xxx.xx | xxx.xx | xxx.xx |
| 15 | xxx.xx | xxx.xx | xxx.xx |
| 16 | xxx.xx | xxx.xx | xxx.xx |
| 17 | xxx.xx | xxx.xx | xxx.xx |
| 18 | xxx.xx | xxx.xx | xxx.xx |
| 19 | xxx.xx | xxx.xx | xxx.xx |
| 20 | xxx.xx | xxx.xx | xxx.xx |
| 21 | xxx.xx | xxx.xx | xxx.xx |
| 22 | xxx.xx | xxx.xx | xxx.xx |
| 23 | xxx.xx | xxx.xx | xxx.xx |
| 24 | xxx.xx | xxx.xx | xxx.xx |
| 25 | xxx.xx | xxx.xx | xxx.xx |
| 26 | xxx.xx | xxx.xx | xxx.xx |
| 27 | xxx.xx | xxx.xx | xxx.xx |

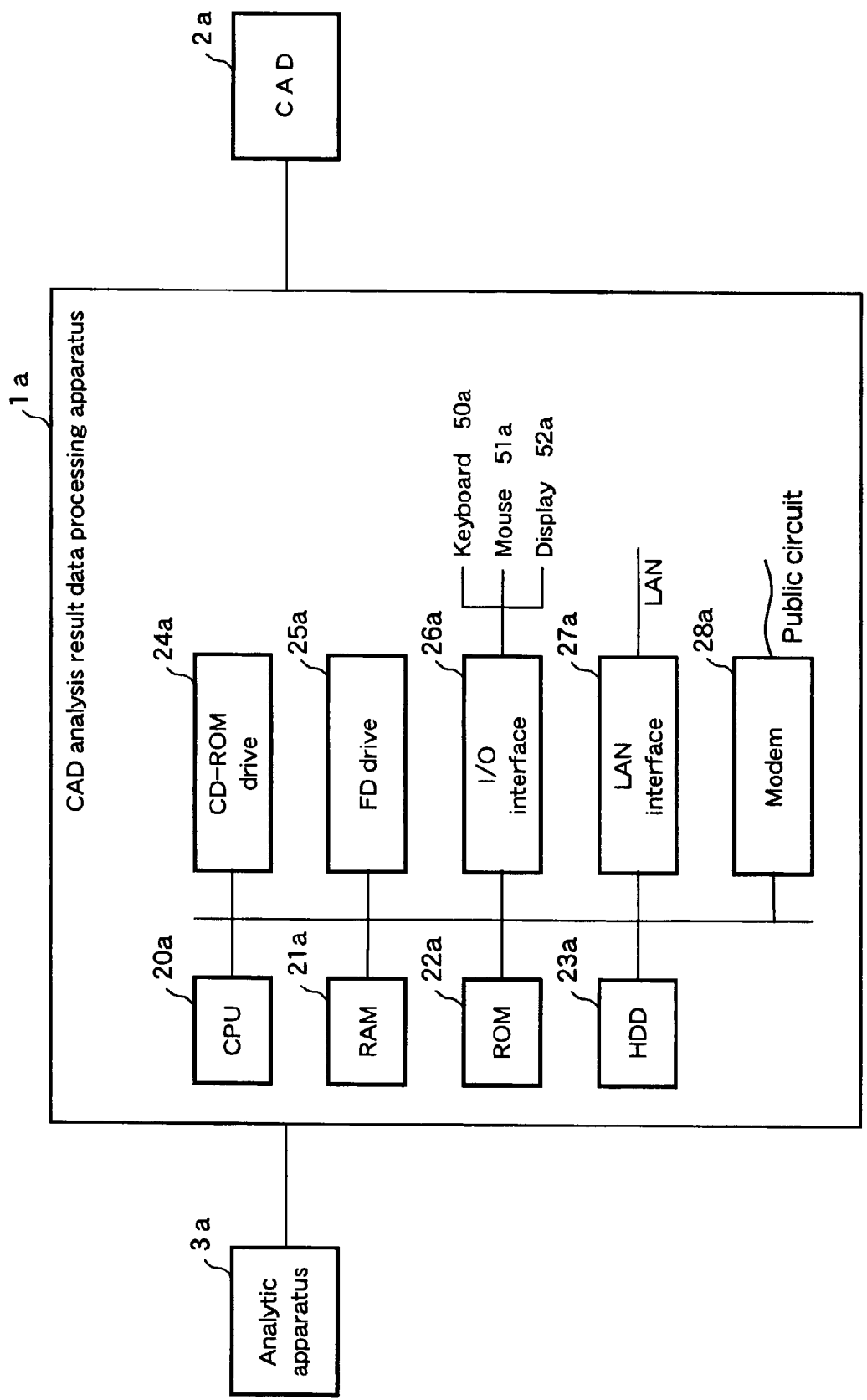

CAD ANALYSIS RESULT DATA PROCESSING APPARATUS, ANALYTIC SIMULATION APPARATUS, CAD ANALYSIS RESULT DATA PROCESSING METHOD AND CAD ANALYSIS RESULT DATA PROCESSING PROGRAM

BACKGROUND OF THE INVENTION

1. Field of the Invention

The present invention relates to a CAD (Computer Aided Design) analysis result data processing apparatus, a CAD analysis result data processing method and a CAD analysis result data processing program for obtaining CAD (Computer Aided Design) processing data from analysis result data obtained from analytic simulation.

2. Description of the Related Art

There is a known analytic apparatus for dividing a model having a three-dimensional form into a plurality of elements and using the divided model (mesh model) to simulate and analyze a physical quantity such as a degree of distortion due to pressure. In the cases of displaying by three-dimensional CAD the model of analysis results (model after deformation) obtained by this analytic apparatus in the past, it often happened that the model processed by the analytic apparatus does not match with the model processed by CAD as to nodes and a basic coordinate to be handled, so that the coordinates of the nodes of the analysis results are manually rearranged to be processable by CAD and inputted to CAD.

FIG. 18 shows details of a flow of the process. Hereafter, as for the models to be analyzed, the model on CAD is referred to as a CAD model, and the model on the analytic apparatus is referred to as an analysis model. In addition, the above-mentioned analytic apparatus is comprised of an analytic solver and a post system. As shown in FIG. 18, first, the CAD model as a former model before the analysis is rendered as a mesh model and is analyzed by the analytic solver (S300) so that the results thereof are stored in a database D1. Next, the post system reads the analysis results of the database D1, and creates the analysis models (visualizing the analysis results) such as a deformation view and a contour view (S301). From this post system, coordinate value data of the nodes constituting the analysis models after the deformation is outputted to the database D2.

Next, arrangements of the nodes of the analysis models are manually checked by an operator (S302). Under normal circumstances, the nodes of the mesh model used for an analysis by the analytic solver are given arbitrary node numbers independently of the CAD model. There are many cases where, if such node data is taken as-is into the CAD, the CAD creates a curve by connecting the nodes in node input order (node number order) resulting in a CAD-drawn model different from what is intended. Therefore, it is necessary to check and correct the arrangement of the nodes before taking the data into the CAD. In S302, the operator imagines the form of the CAD-drawn model only from numerical data (coordinate values of the nodes) so as to rearrange the order of the nodes. The rearranged coordinate values are stored in a database D3.

The coordinate values after the deformation stored in the database D3 are inputted to the CAD. The CAD takes in the inputted coordinate values as points (nodes) for the curve so as to create the curve first. Subsequently, the operator creates the surface while manually determining the surface constituting a model boundary by using the created curve. All the surfaces thus created are merged and rendered solid by the CAD (S303).

The approach described above is a general approach conducted when taking the analysis result data into the CAD.

Apart from such an approach, there is another thinkable approach of using a surface-specific modeler for taking in point group data of the real thing measured with a three coordinate measuring machine or the like to surface and edit it. For instance, it is an idea that node coordinates in a deformed form obtained by the analytic solver are regarded as measured point group data so as to be taken into the surface-specific modeler and surfaced, and the surfaced data is taken into CAD.

In addition, apart from the surface-specific modeler, there exists dedicated software having a function of constructing the surface only from provided point group data.

However, in the case of the past approach shown in FIG. 18, its working efficiency is low since the operator has to imagine the form of the CAD-drawn model from the coordinate values of the nodes of the analysis model and manually rearrange the order of the nodes when inputting the data to the CAD. In addition, the manual work is apt to cause an error in the rearrangement so that it is not guaranteed to create an intended form surface by the CAD. Furthermore, while this approach is applicable to a model which is simple enough for the operator to estimate the form thereof from the coordinate values to an extent, it is not applicable to a model having a complicated form.

In addition, while graphics drawing/editing by the CAD only requires the model's outside form data, the approach using the surface-specific modeler has a problem that even the point group and surfaces inside the model which are unnecessary for the CAD are taken in, resulting in larger amounts of handled data and slower processing speed. Moreover, this causes a problem that, when taking the data into the CAD, it can no longer be automatically rendered solid due to the surface constructed inside the model. Furthermore, when surfacing, the surface-specific modeler constructs the surfaces by using all the points taken in and repeating complicated geometric calculation, and so there is no guarantee that the intended form will be obtained due to influence of a calculation error and so on. Moreover, its working efficiency is low since there are many cases where corrections such as movement and elimination of the nodes are necessary in the surfacing process.

In addition, the dedicated software having the function of constructing the surface only from the provided point group data has a problem that it is very expensive and its operation is difficult and requires a high-level technique.

To be more specific, according to the above-mentioned approach in the past, the analysis result data cannot be taken into the CAD fully automatically. In addition, there is a problem that, as all the node data of the analysis model is taken in and processed, output and processing of redundant data occurs.

The present invention has been conducted in consideration of the above circumstances, and an object thereof is to provide a CAD analysis result data processing apparatus, a CAD analysis result data processing method and a CAD analysis result data processing program capable of automatically obtaining only the information necessary for CAD processing from the analysis result data of analytic simulation with a simple mechanism and rendering the handled data lightweight.

SUMMARY OF THE INVENTION

In order to solve the above-mentioned problems, the present invention provides a CAD analysis result data processing apparatus comprising:

analysis result data obtaining part for obtaining analysis result data of analytic simulation for dividing an object having a three-dimensional form into a plurality of elements and performing an analysis of a predetermined physical quantity;

extracting part for, based on the analysis result data obtained by said analysis result data obtaining part, extracting surfaces constituting an outside form of said object from the surfaces constituting said plurality of elements; and coordinate obtaining part for, based on the analysis result data obtained by said analysis result data obtaining part, obtaining coordinates of said object after deformation by said analytic simulation for nodes constituting the surfaces extracted by said extracting part.

According to this configuration, it is possible, when taking the analysis result data into CAD, to extract only the points constituting an outside form of a model instead of all the node data, so that the nodes inside the model unnecessary for CAD can be cut and data capacity and processing time can be reduced. Moreover, in the embodiment of the present invention, the analysis result data obtaining part is comprised of an analysis result data obtaining portion, the extracting part is comprised of a boundary surface extracting portion, and the coordinate obtaining part is comprised of a coordinate data obtaining portion.

In addition, according to the CAD analysis result data processing apparatus related to the present invention, the analysis result data obtained by the above described analysis result data obtaining part may be characterized by including coordinate information on the object after deformation by the analytic simulation.

According to this configuration, it is possible, as the coordinates of the object after the deformation required for CAD processing can be taken in, to easily display the analysis results on the CAD.

In addition, according to the CAD analysis result data processing apparatus related to the present invention, the above described extracting part has shared surface determining part for determining a shared surface shared by the plurality of elements from the surfaces constituting the above described plurality of elements and excluding the shared surface determined by the shared surface determining part from the surfaces constituting the outside form of the object so as to extract the surfaces constituting the outside form of the object.

According to this configuration, it is possible to easily extract only the surfaces constituting the outside form of the object. Moreover, according to the embodiment, the shared surface determining part is comprised of a boundary surface extracting portion.

In addition, according to the CAD analysis result data processing apparatus related to the present invention, the above described shared surface determining part may also be characterized in that, in the case where the nodes constituting the surface of certain elements completely match with the nodes constituting the surface of other elements, it determines that the surface constituted by the matching nodes is the shared surface.

According to this configuration, the processing is rendered faster since a shared surface can be easily determined just by comparing and verifying coordinate values of the nodes constituting each element without performing complicated processing.

In addition, according to the CAD analysis result data processing apparatus related to the present invention, the above described coordinate obtaining part may also be characterized in that it has overlapping node eliminating part for eliminating overlapping of the nodes constituting the surfaces extracted by said extracting part, and obtains the coordinates of the above described object after deformation for the nodes after elimination by the overlapping node eliminating part.

According to this configuration, the overlapping coordinates of the node are no longer obtained, and so wasteful processing is omitted to shorten the processing time. Moreover, according to the embodiment, the overlapping node eliminating part is comprised of the coordinate data obtaining portion.

In addition, according to the CAD analysis result data processing apparatus related to the present invention may also be characterized by having CAD processing data generating part for generating as CAD processing data a list of the surfaces extracted by the above described extracting part and a coordinate list of the nodes obtained by the above described coordinate obtaining part.

According to this configuration, it is possible to generate as the CAD processing data the coordinates of the surfaces constituting the outside form and the nodes constituting the surfaces, and so there is no need of complicated calculation when connecting the nodes by the CAD and the surfaces can be formed just by simple comparison operation. Moreover, according to the embodiment, the CAD processing data generating part is comprised of a CAD data processing portion.

In addition, according to the CAD analysis result data processing apparatus related to the present invention, the above described analysis result data obtaining part converts and obtains the analysis result data, as to the above described object having the three-dimensional form, so that a basic coordinate system on the analytic simulation matches with the basic coordinate system on the CAD.

According to this configuration, it is possible to completely prevent a difference in the basic coordinate systems when taking the analysis result data into the CAD so as to allow the model before the deformation (CAD model) and the model after the deformation (analysis result model) to be displayed with the models superimposed. Moreover, while the operator specifies an algorithm for conversion according to a reference position specification menu started by an analysis result data obtaining portion to obtain the analysis result data according to this embodiment, it may also be automatically specified by a computer.

Further, the present invention provides a CAD having the CAD analysis result data processing apparatus comprising analysis result data obtaining part for obtaining analysis result data of analytic simulation for dividing an object having a three-dimensional form into a plurality of elements and performing an analysis of a predetermined physical quantity; extracting part for, based on the analysis result data obtained by said analysis result data obtaining part, extracting surfaces constituting an outside form of said object from the surfaces constituting said plurality of elements; coordinate obtaining part for, based on the analysis result data obtained by said analysis result data obtaining part, obtaining coordinates of said object after deformation by said analytic simulation for nodes constituting the surfaces extracted by said extracting part; CAD execution processing part for performing drawing or editing; and a CAD database storing CAD data necessary for processing in said CAD execution processing part.

According to this configuration, it is not necessary to master a high-level technique compared to the cases of operating a surface-specific modeler other than the CAD or other dedicated software, so that it is possible to take the analysis results into the CAD just by simple specification of a command on the CAD. In addition, it provides a CAD analysis result data processing function as one function of a CAD system so that processing at a lower cost than the surface-specific modeler and so on is possible.

Furthermore, the present invention provides an analytic simulation apparatus having an analytic apparatus and a CAD, wherein said CAD comprises analysis result data obtaining part for obtaining analysis result data of analytic simulation for dividing an object having a three-dimensional form into a plurality of elements and performing an analysis of a predetermined physical quantity; extracting part for, based on the analysis result data obtained by said analysis result data obtaining part, extracting surfaces constituting an outside form of said object from the surfaces constituting said plurality of elements; coordinate obtaining part for, based on the analysis result data obtained by said analysis result data obtaining part, obtaining coordinates of said object after deformation by said analytic simulation for nodes constituting the surfaces extracted by said extracting part; CAD execution processing part for performing drawing or editing; and a CAD database storing CAD data necessary for processing in said CAD execution processing part.

According to this configuration, the processing becomes more efficient since the CAD processing data can be generated on the analytic simulation apparatus.

Furthermore, the present invention provides a CAD analysis result data processing method having: a first step of obtaining analysis result data of analytic simulation for dividing the object having the three-dimensional form into a plurality of elements and performing an analysis of a predetermined physical quantity; a second step of, based on the analysis result data obtained by the above described first step, extracting surfaces constituting an outside form of the above described object from the surfaces constituting the above described plurality of elements; and a third step of, based on the analysis result data obtained by the above described first step, obtaining coordinates of the above described object after deformation by the above described analytic simulation for nodes constituting the surfaces extracted by the above described second step.

Furthermore, the present invention is a CAD analysis result data processing program stored in a medium readable by a computer for causing the computer to perform a process for obtaining the CAD processing data from analysis result data, and the above described program is characterized by causing the computer to execute: a first step of obtaining analysis result data of analytic simulation for dividing the object having the three-dimensional form into the plurality of elements and performing the analysis of the predetermined physical quantity; a second step of, based on the analysis result data obtained by the above described first step, extracting surfaces constituting the outside form of the above described object from the surfaces constituting the above described plurality of elements; and a third step of, based on the analysis result data obtained by the above described first step, obtaining the coordinates of the above described object after deformation by the above described analytic simulation for the nodes constituting the surfaces extracted by the above described second step.

Moreover, according to the present invention, the media readable by the computer include portable storage media such as a CD-ROM, a flexible disk, a DVD disk, a magneto-optical disk and an IC card, a database holding a computer program or another computer and its database, and furthermore, transmission media on a circuit.

BRIEF DESCRIPTION OF THE DRAWINGS

FIGS. 5(a), 5(b), 5(c), and 5(d) show examples of basic coordinate systems of a CAD model and an analysis model, specified contents in the reference position specification menu, and display examples of the CAD model and analysis model previewed based on the specified contents;

FIGS. 6(a), 6(b), 6(c), and 6(d) show examples of the basic coordinate systems of the CAD model and the analysis model, the specified contents in the reference position specification menu, and display examples of the CAD model and analysis model previewed based on the specified contents;

FIGS. 7(a), 7(b), 7(c), and 7(d) show examples of the basic coordinate systems of the CAD model and the analysis model. The specified contents in the reference position specification menu, and display examples of the CAD model and analysis model previewed based on the specified contents;

FIG. 8 shows element definition information;

FIG. 13 is surface information on the element <1> composed according to an element definition rule;

FIG. 14 is the surface information on the element <2> composed according to the element definition rule;

FIG. 15 is a diagram showing a generated surface list;

FIG. 16 is a drawing showing a generated coordinate value list;

FIG. 17 is a diagram showing an overall block diagram in the case where the CAD analysis result data processing apparatus is provided independently of the CAD.

DETAILED DESCRIPTION OF THE PREFERRED EMBODIMENTS

This embodiment will be described by taking an example of a CAD analysis result data processing apparatus which obtains analysis result data from an analytic apparatus for performing analytic simulation on a model of an analysis object having a three-dimensional form to analyze a degree of distortion and so on and generates CAD data (data for processing the model by CAD) of the model after deformation based on the obtained analysis result data. Furthermore, in this embodiment, the model before the deformation is displayed by the CAD in advance so as to display the models before and after the deformation with the models superimposed.

Moreover, according to this embodiment, the CAD analysis result data processing apparatus is a part of the system provided on the CAD. To be more specific, a program group for performing a process of the CAD analysis result data processing apparatus on the CAD is stored on a predetermined record medium in advance, and the program group is expanded in a memory on starting the CAD so as to operate.

Figure 1:
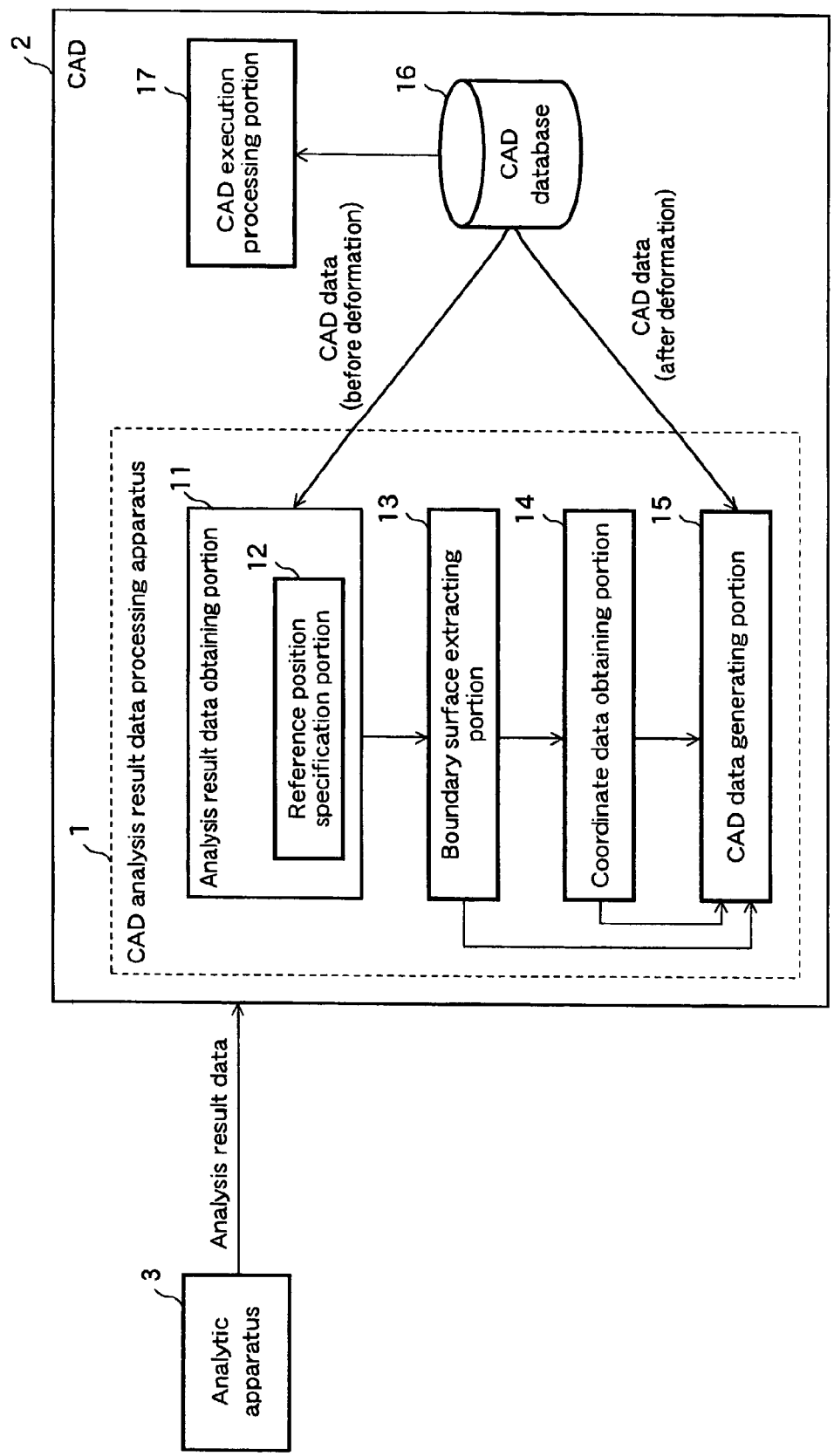
FIG. 1 is a functional block diagram of a CAD analysis result data processing apparatus according to an embodiment of the present invention.
Figure 2:
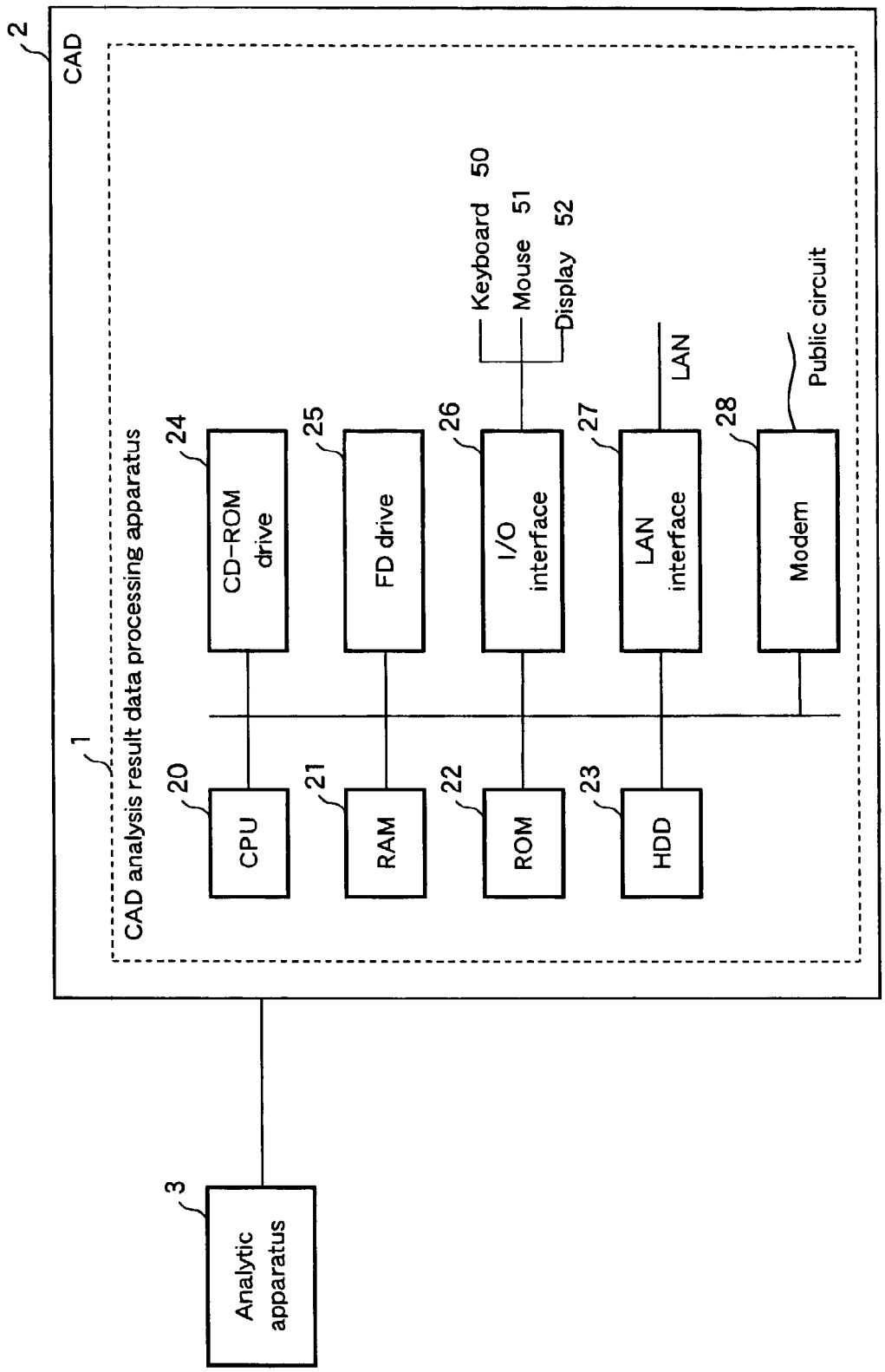
FIG. 2 is an overall block diagram of this embodiment.

FIG. 1 is a functional block diagram of the CAD analysis result data processing apparatus according to this embodiment of the present invention, and FIG. 2 is an overall block diagram of this embodiment. In FIG. 1, a CAD 2 is comprised of a CAD analysis result data processing apparatus 1, a CAD execution processing portion 17 for performing drawing, editing and so on, and a CAD database 16 storing CAD data necessary for processing in the CAD execution processing portion 17.

The CAD analysis result data processing apparatus 1 is comprised of an analysis result data obtaining portion 11, a boundary surface extracting portion 13, a coordinate data obtaining portion 14 and a CAD data generating portion 15.

The analysis result data obtaining portion 11 reads the analysis result data from an analytic apparatus 3 for performing analysis by simulation so as to obtain necessary data. Of the surfaces constituting the model used on the analytic apparatus 3, the boundary surface extracting portion 13 extracts the surfaces constituting the outside form of the analysis object model (boundary surfaces) based on the analysis result data. The coordinate data obtaining portion 14 obtains the coordinates of the nodes constituting the boundary surface from the analysis result data. The CAD data generating portion 15 generates CAD processing data (CAD data) based on the surface extracted by the boundary surface extracting portion 13 and the coordinate data obtained by the coordinate data obtaining portion 14.

In addition, the analysis result data obtaining portion 11 has a reference position specification portion 12 for setting a coordinate transformation algorithm intended to match the basic coordinate system used when drawing the CAD model before deformation in the CAD execution processing portion 17 with the basic coordinate system used in the analytic process on the analytic apparatus 3. When the analysis result data obtaining portion 11 obtains the analysis result data, it acquires coordinate values of the nodes of the analysis model after deformation based on initial coordinate values of the nodes constituting the analysis model and a displacement amount by simulation of the analysis result data read from the analytic apparatus 3, and further converts them according to the algorithm set by the reference position specification portion 12 so as to obtain the converted coordinate values.

In the overall block diagram of FIG. 2, the CAD 2 (CAD analysis result data processing apparatus 1) is comprised of a CPU (Central Processing Unit) 20, a RAM (Random Access Memory) 21, a ROM (Read Only Memory) 22, an HDD (Hard Disk Drive) 23, a CD-ROM drive 24, an FD (Flexible Disk) drive 25, input devices such as a keyboard 50 and a mouse 51, output devices such as a display 52, an I/O (Input/Output) interface 26 for connecting to the input devices and output devices, a LAN interface 27 for connecting to a LAN (Local Area Network), and a modem 28 for connecting to a public circuit. In this embodiment, each functional block on the CAD shown in the functional block diagram of FIG. 1 shows a state in which the program group stored on an HDD 23 in FIG. 1 are expanded on a RAM 21 on starting the CAD 2, which is executed by a CPU 20. In addition, the CAD database 16 is provided in a predetermined area of the HDD 23.

Moreover, the program group may be stored not necessarily on the HDD 23 but also on the media readable by the computer such as the portable storage media including a CD-ROM, an FD, a magnetic disk, a DVD disk, a magneto-optical disk and an IC card for instance, and it may also be downloaded from a database holding a computer program or another computer and its database, and furthermore, transmission media on a circuit or the like so as to be stored on the RAM 21 to be executed, where an installation form of the program group is not limited. As mentioned above, the CD-ROM drive 24 and the FD drive 25 are provided in this embodiment, so that it is possible to read the portable storage media. In addition, it has a configuration wherein the program group can be easily downloaded from other computers and databases by the LAN interface 27 and modem 28 via the LAN and public circuit.

In addition, the CAD 2 and analytic apparatus 3 may be connected by the LAN interface 27 or modem 28, or if not connected, the data may be obtained from the apparatus 3 via the portable storage media such as the CD-ROM and FD, where the connection form is not limited.

Figure 3:
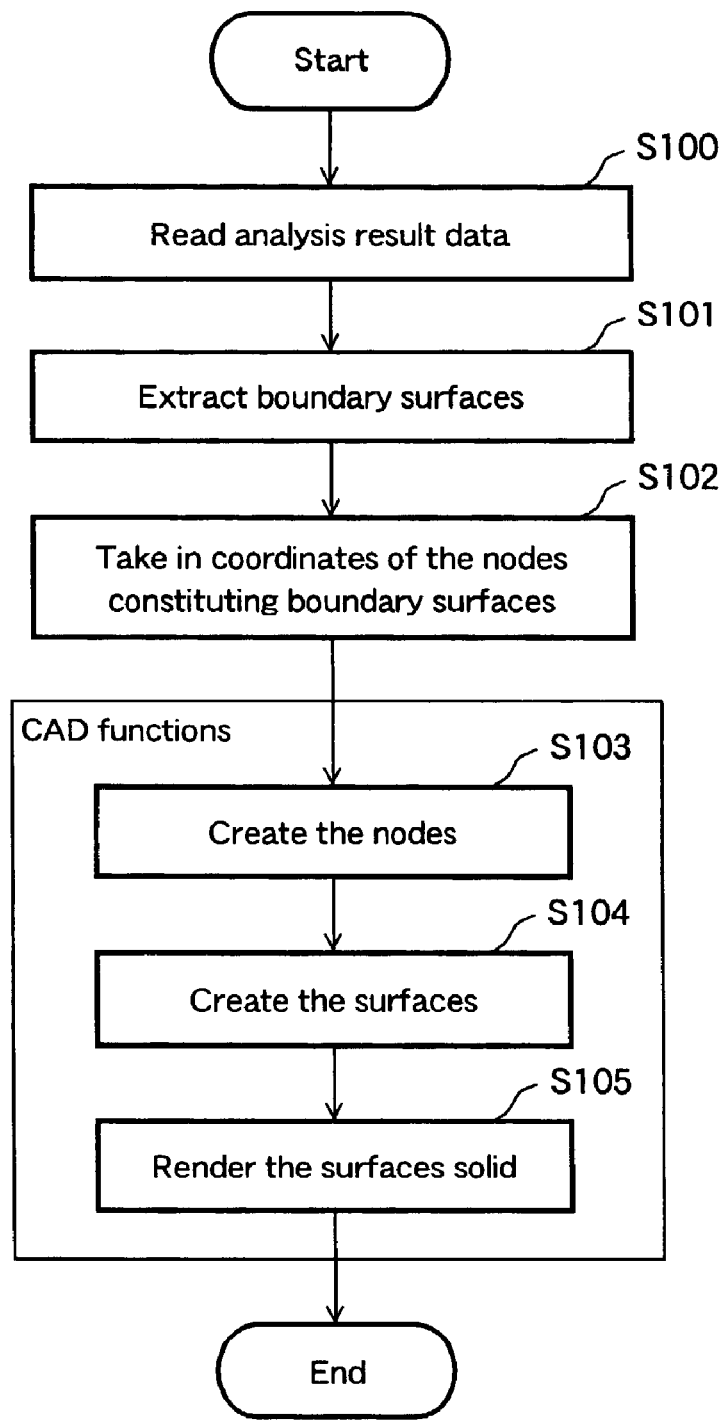
FIG. 3 is the flowchart showing the entire processing flow.

Hereafter, a flow of the processing of the CAD analysis result data processing apparatus 1 will be described in detail by using a flowchart. FIG. 3 is the flowchart showing the entire processing flow. First, the operator has the CAD model before the deformation displayed on a display 52 by the CAD execution processing portion 17 of the CAD 2. In addition, the analysis result data obtaining portion 11 obtains the analysis result data by reading it from the analytic apparatus 3 (S100).

Moreover, the analysis result data obtaining portion 11 converts and obtains the coordinate values of the analysis model so that the basic coordinate system used in the analytic simulation on the analytic apparatus 3 matches with the basic coordinate system on the CAD based on a setting in the reference position specification portion 12. Details of this process will be described later.

Figure 4:
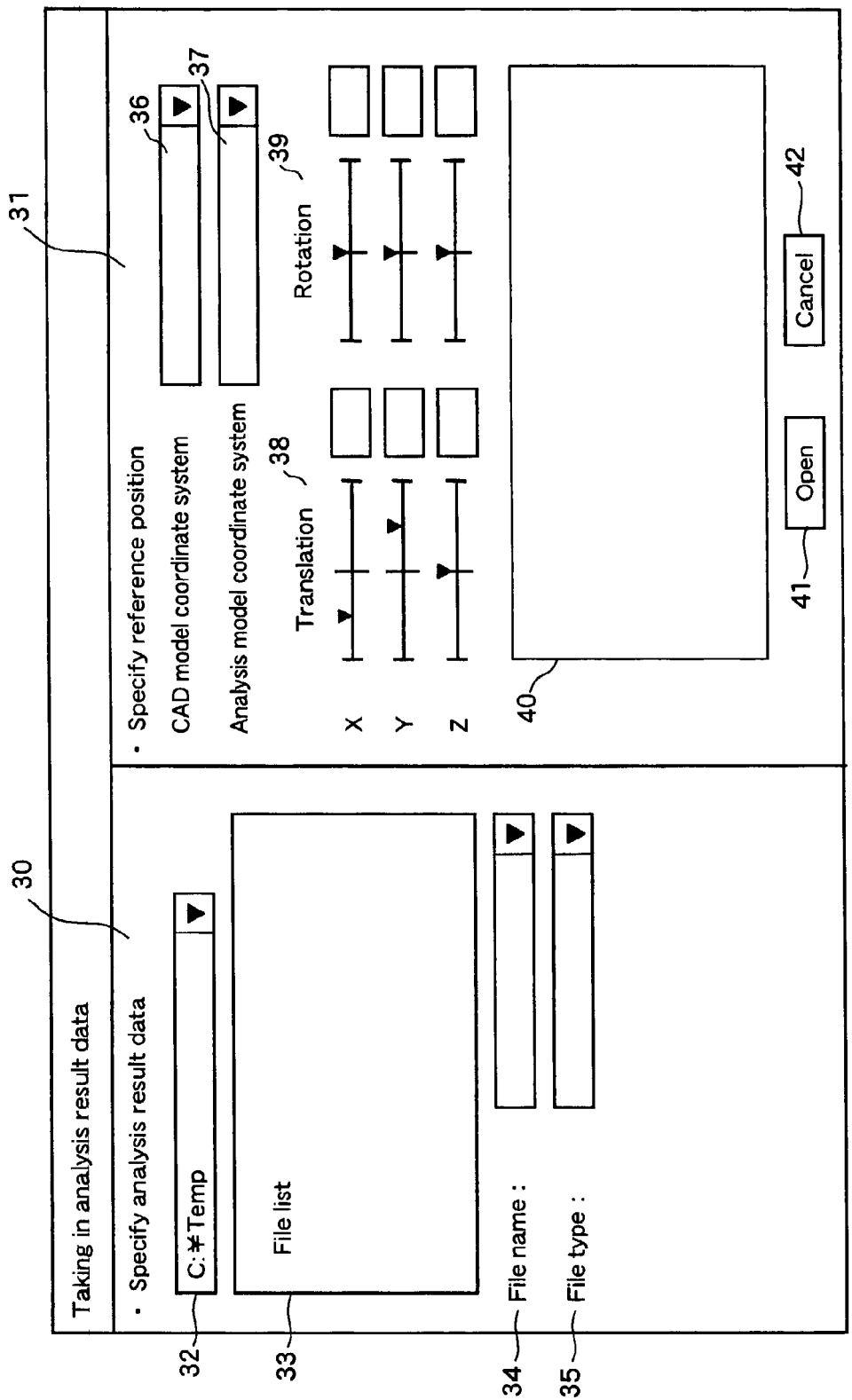
FIG. 4 shows examples of an analysis result data specification menu and a reference position specification menu.

Furthermore, in the case where there are a plurality of the analysis object models, or in the case where there are a plurality of analytic types for an identical analysis object model, it is necessary for the operator to specify the data thereof to be taken into the CAD. In this embodiment, the operator specifies and obtains desired analysis result data from the plurality of the analysis result data on the analytic apparatus 3. To be more specific, before actually taking in the analysis result data, a list of analysis result data files is read from a summary on the analytic apparatus 3 onto an analysis result data specification menu provided by the analysis result data obtaining portion 11, and the operator specifies the data to be taken in by specifying a desired file from the list. The analysis result data specification menu is first set to be started as the operator has the CAD model before the deformation displayed on the screen. An example of the analysis result data specification menu is shown in FIG. 4.

A window shown on the left hand side of the drawing is an analysis result data specification menu 30. As shown, the analysis result data specification menu 30 has a directory combo box 32, a file listing list box 33, a file name combo box 34 and a file type combo box 35 incorporated therein. Inputting to the analysis result data specification menu 30 is performed by the keyboard 50 or mouse 51.

The directory combo box 32 has directory names on the system displayed therein, and the operator can select from the displayed directory names a directory storing the analysis result data desired to be displayed by the CAD.

The file type combo box 35 has a list of extensions (analysis types) of the analysis result data which can be taken in displayed therein, and the operator can select from the displayed analysis types the analysis type desired to be taken in.

The file listing list box 33 has a list of files having the extensions specified by the file type combo box 35 displayed therein, of the files existing in the directory specified by directory combo box 32. The operator can select from the displayed list of files the file name desired to be taken in.

The file name combo box 34 has the file names specified by the file listing list box 33 displayed therein. The file name displayed in this box is set as the data to be taken into the CAD.

Subsequently, the coordinate transformation algorithm intended to match the basic coordinate system on the analytic apparatus 3 with the basic coordinate system on the CAD is set by the reference position specification portion 12. According to this embodiment, it is set from the reference position specification menu provided by the reference position specification portion 12. An example of the reference position specification menu is shown in FIG. 4.

The window shown on the right hand side of the drawing is a reference position specification menu 31. As shown, the reference position specification menu 31 has a basic coordinate system combo box 36 of the CAD model, a basic coordinate system combo box 37 of the analysis model, a translation specification area 38, a rotation specification area 39, a preview window 40, an "Open" button 41 and a "Cancel" button 42 incorporated therein. Inputting to this menu is performed by the keyboard 50 or mouse 51. In addition, as this menu is displayed together with the above-mentioned analysis result data specification menu 30, the operator can start reference position specification work immediately on finishing the work according to the analysis result data specification menu.

The basic coordinate system combo box 36 of the CAD model has a list of the coordinate systems defined on the CAD model displayed therein, and the operator can select an applicable coordinate system from the displayed coordinate systems.

The basic coordinate system combo box 37 of the analysis model has a list of the coordinate systems defined on the analysis model displayed therein, and the operator can select the applicable coordinate system from the displayed coordinate systems.

The preview window 40 previews a state of the CAD model displayed in advance and the analysis model applicable to the file specified by the analysis result data specification menu 30. Moreover, the analysis model is previewed as the CAD model as-is as the form before the deformation, which is shown without making any change such as movement or rotation unless specified to change in the translation specification area 38 and rotation specification area 39. However, the basic coordinate system is displayed according to the specification by the basic coordinate system combo box 37. In addition, the CAD model and the analysis model are displayed in different colors so as to be clearly differentiated on the screen.

In the translation specification area 38, the operator can determine an amount of movement of the analysis model with a slider bar or direct input of a value as shown. If the operator specifies the amount of movement, the analysis model on the preview window 40 moves by the specified amount.

In the rotation specification area 39, the operator can determine an amount of rotation of the analysis model with a slider bar or direct input of a value as shown. If the operator specifies the amount of rotation, the analysis model on the preview window 40 rotates by the specified amount.

If the operator pushes the "Open" button 41 at a stage where the specification in the translation specification area 38 and rotation specification area 39 is finished, the analysis result data obtaining portion 11 converts and obtains the analysis result data specified by the analysis result data specification menu 30 according to the specification inputted. In addition, on pushing the "Cancel" button 42, the analysis result data obtaining portion 11 abandons all the inputted information and closes a dialog in FIG. 4.

Hereafter, the specification work on the reference position specification menu 31 will be described by showing concrete examples in FIGS. 5 to 7. Moreover, in all the concrete examples taken below, only one coordinate system for each model is defined, that is, a coordinate system CS01 for the CAD model and a CSYS1 for the analysis model. In addition, each of the drawings has (A) as a drawing showing the CAD model (before the deformation) and its basic coordinate system CS01, (B) as a drawing showing the analysis model (before the deformation, and the same in display as the CAD model before the deformation) and its basic coordinate system CSYS1, and (C) as a drawing showing the specified contents of the translation and rotation. In addition, (D) is a drawing showing the state in the case of matching the basic coordinate system of the analysis model with that of the CAD model based on the specified contents of (C), and its state of change is displayed on the preview window 40.

FIG. 5 shows a model in the case where the basic coordinate system on the CAD and that on the analytic simulation are the same. As is clear from FIGS. 5(A) and (B), both the basic coordinate systems are identical, so that the amounts of change (amounts of movement) of the translation and those of the rotation (amounts of rotation) specified by the operator are all 0 for each axis of coordinates as shown in FIG. 5(C). Thus, there is no change to the analysis model as shown in FIG. 5(D). Accordingly, the analysis result data obtaining portion 11 does not change the coordinate values of the analysis model when obtaining the analysis result data.

FIG. 6 shows a model in the case where the basic coordinate system on the CAD and that on the analytic simulation are different. As is clear from FIGS. 6(A) and (B), the basic coordinate systems are different but the directions of the axes are identical, so that the amounts of change of the rotation (amounts of rotation) specified by the operator are all 0 for each axis of coordinates as shown in FIG. 6(C). In addition, as for the amount of change of the translation (amount of movement), a width of the model is added in the X-axis direction and a height of the model is added in the Z-axis direction. Thus, as shown in FIG. 6(D), the analysis model is previewed in the state of being subtracted by the width of the model in the X-axis direction and subtracted by the height of the model in the Z-axis direction. Accordingly, when obtaining the analysis result data, the analysis result data obtaining portion 11 obtains it by moving the coordinate values of the analysis model by specified amounts.

As with FIG. 6, FIG. 7 shows a model in the case where the basic coordinate system on the CAD and that on the analytic simulation are different. As is clear from FIGS. 7(A) and (B), the positions of the basic coordinate systems and the directions of the axes are different. For this reason, the amount of change of the translation (amounts of movement) and those of the rotation (amounts of rotation) are specified by the operator as shown in FIG. 7(C). On the preview window 40, they are displayed as shown in FIG. 7(D) based on the specification. When obtaining the analysis result data, the analysis result data obtaining portion 11 obtains it by moving and rotating the coordinate values of the analysis model by specified amounts.

Subsequently, a flow of the processing for actually obtaining the analysis result data based on the above-mentioned specification will be described. On the reference position specification menu 31, if the operator pushes the "Open" button 41 after specifying the translation and rotation, the analysis result data obtaining portion 11 starts taking in the analysis result data. First, it reads the initial coordinate value and displacement amount of each node constituting the specified analysis result data (analysis model) to calculate initial coordinate value plus displacement amount so as to acquire the coordinate value after the deformation. The movement and rotation (coordinate conversion) in each axis direction are performed to the acquired coordinate value after the deformation based on the specification of the translation and rotation.

Hereafter, a technique of coordinate conversion is concretely shown.

Moreover, parameters are represented as follows.

Initial coordinate values of the analysis model: (x, y, z)

Specified translation amounts: (l, m, n)

Specified rotation amounts: ($\theta x$, $\theta y$, $\theta z$)

The movements of the coordinate values are shown as follows.

In the case of l>0, move the coordinate value in the X-axis direction.

$x=x+l$

In the case of m>0, move the coordinate value in the Y-axis direction.

$y=y+m$

In the case of n>0, move the coordinate value in the Z-axis direction.

$z=z+n$

The rotations of the coordinate values are shown as follows.

In the case of $\theta x>0$, rotate the coordinate value about the X-axis.

$x=x$ $y=y\cdot\cos(\theta x)+z\cdot\sin(\theta x)$ $z=-y\cdot\sin(\theta x)+z\cdot\cos(\theta x)$ In the case of $\theta y>0$, rotate the coordinate value about the Y-axis.

$x=x\cdot\cos(\theta y)-z\cdot\sin(\theta y)$ $y=y$ $z=x\cdot\sin(\theta y)+z\cdot\cos(\theta y)$ In the case of $\theta z>0$, rotate the coordinate value about the Z-axis.

$x=x\cdot\cos(\theta z)+y\cdot\sin(\theta z)$ $y=-x\cdot\sin(\theta z)+y\cdot\cos(\theta z)$ $z=z$ Moreover, when specifying the translation and rotation in this embodiment, the change in the movement and rotation amounts are displayed as preview in real time so as to prevent differences in results due to order of rotation. On that occasion, the order of the movement and rotation in each axis direction is kept so that the conversion is performed according to the kept order when actually taking them in.

In addition, while the translation and rotation are specified by the operator in this embodiment as described above, it is not limited thereto since it is also possible to have them automatically specified by the computer.

The analysis result data obtaining portion 11 obtains the converted coordinate values as the analysis result data. Furthermore, it simultaneously reads an element definition portion of the analysis model from the summary on the analytic apparatus 3 so as to obtain definition information. Moreover, in the analytic apparatus 3 while the model to be analyzed is divided into a plurality of elements and the analytic simulation is performed by using the divided model (mesh model), the element definition portion refers to an area storing the definition information on the nodes constituting the elements on the analytic apparatus 3.

For instance, the element definition portion has the elements defined in order of the nodes 1, 2, 3, 4, 5, 6, 7 and 8 as shown in FIG. 8.

In this case, element constituting edges (shown by → in the drawing) can be uniquely determined as follows.

Edge 1 A line segment connecting node 1 and node 2
Edge 2 A line segment connecting node 2 and node 3
Edge 3 A line segment connecting node 3 and node 4
Edge 4 A line segment connecting node 4 and node 1
Edge 5 A line segment connecting node 5 and node 6
Edge 6 A line segment connecting node 6 and node 7
Edge 7 A line segment connecting node 7 and node 8
Edge 8 A line segment connecting node 8 and node 5
Edge 9 A line segment connecting node 1 and node 5
Edge 10 A line segment connecting node 2 and node 6
Edge 11 A line segment connecting node 3 and node 7
Edge 12 A line segment connecting node 4 and node 8

Likewise, element constituting surfaces (shown in ( ) in the drawing) are also uniquely determined.

Figures 9, 10:
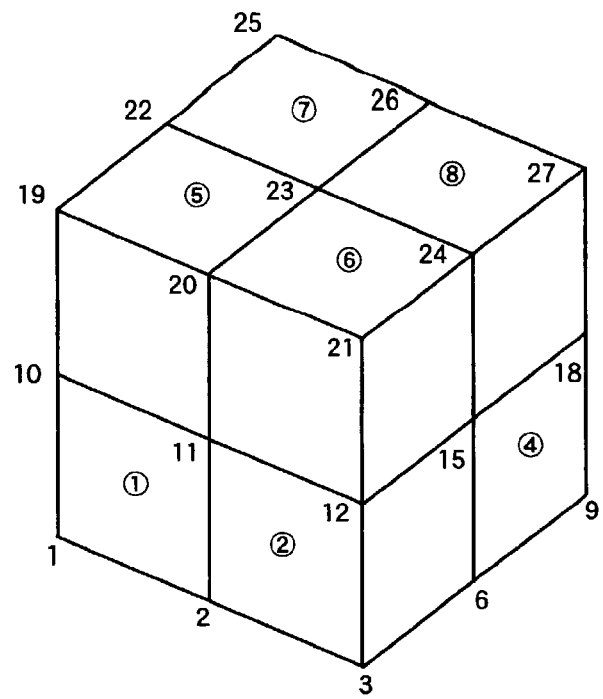
FIG. 9 shows an example of the analysis model.
FIG. 10 shows definition information on the analysis model in FIG. 9.
Figure 11A:
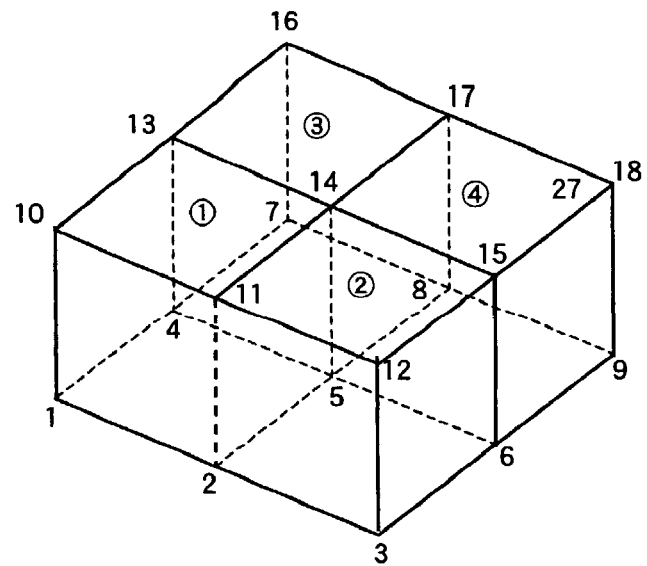
FIGS. 11 (A) and (B) are the drawings showing internal nodes and elements which are invisible in FIG. 9.
Figure 11B:
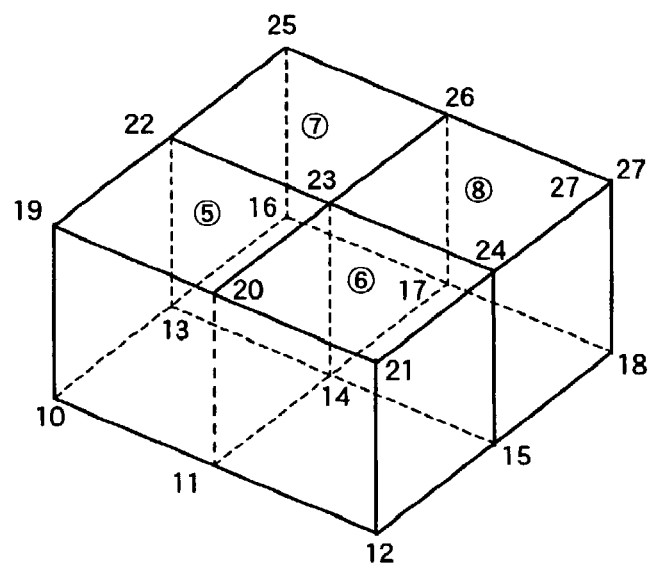

Surface 1 A surface constituted by the first 4 points of the element definition nodes Surface 2 A surface constituted by the remaining 4 points of the element definition nodes Surface 3 A surface having the Edge 1 and the Edge 5 as opposite sides Surface 4 A surface having the Edge 2 and the Edge 6 as opposite sides Surface 5 A surface having the Edge 3 and the Edge 7 as opposite sides Surface 6 A surface having the Edge 4 and the Edge 8 as opposite sides Thus, the analysis result data obtaining portion 11 obtains the analysis result data (S100), and subsequently the boundary surface extracting portion 13 extracts the surfaces constituting the outside form of the analysis object model (boundary surfaces) of the surfaces constituting the model used on the analytic apparatus 3 (FIG. 3, S101). The extraction process will be described by using the model shown in FIG. 9. <1> to <8> in the drawing are the numbers for identifying the elements, and the elements are defined by the nodes 1 to 26. The definition information is shown in FIG. 10. In addition, FIGS. 11 (A) and (B) are the drawings showing internal nodes and elements which are invisible in FIG. 9. Moreover, the elements in the lower portion of FIG. 9 are in FIG. 11 (A), and the elements in the upper portion of FIG. 9 are in FIG. 11 (B).

Figure 12:
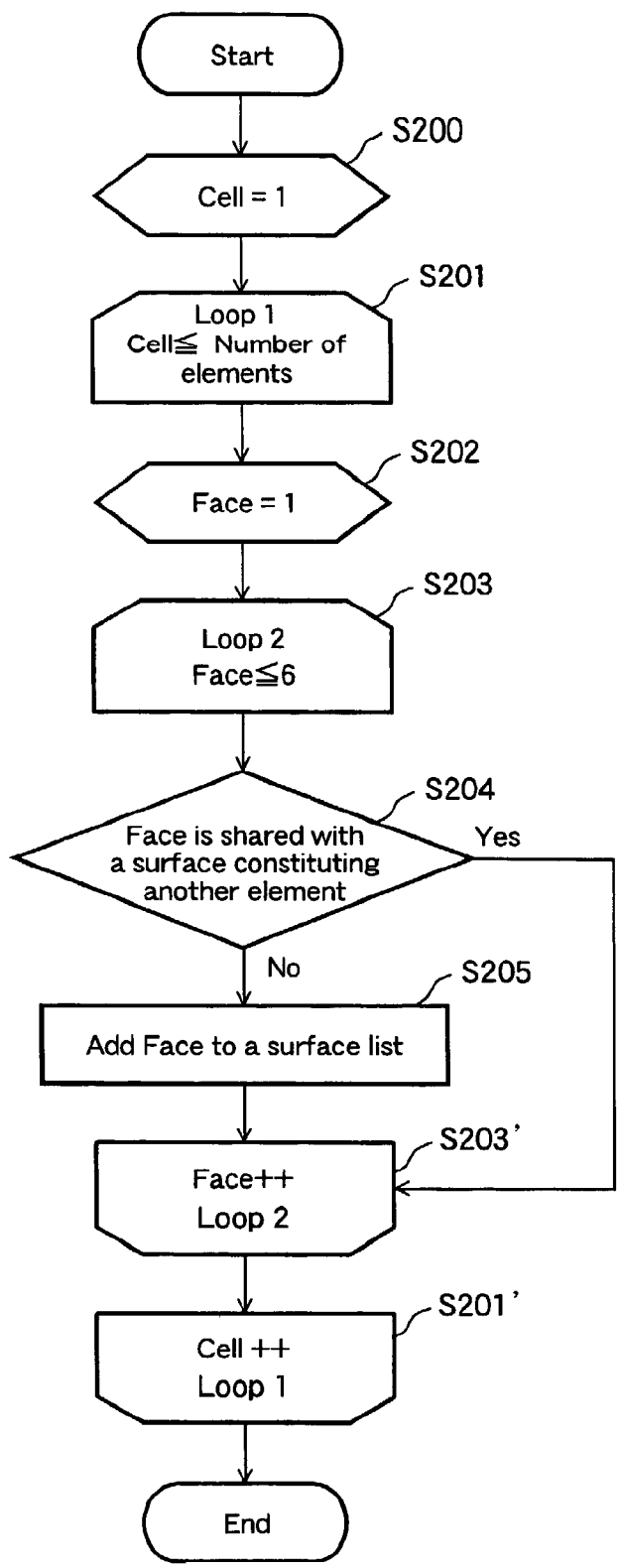
FIG. 12 is a flowchart showing a flow of the boundary surface extraction process.
Figure 18:
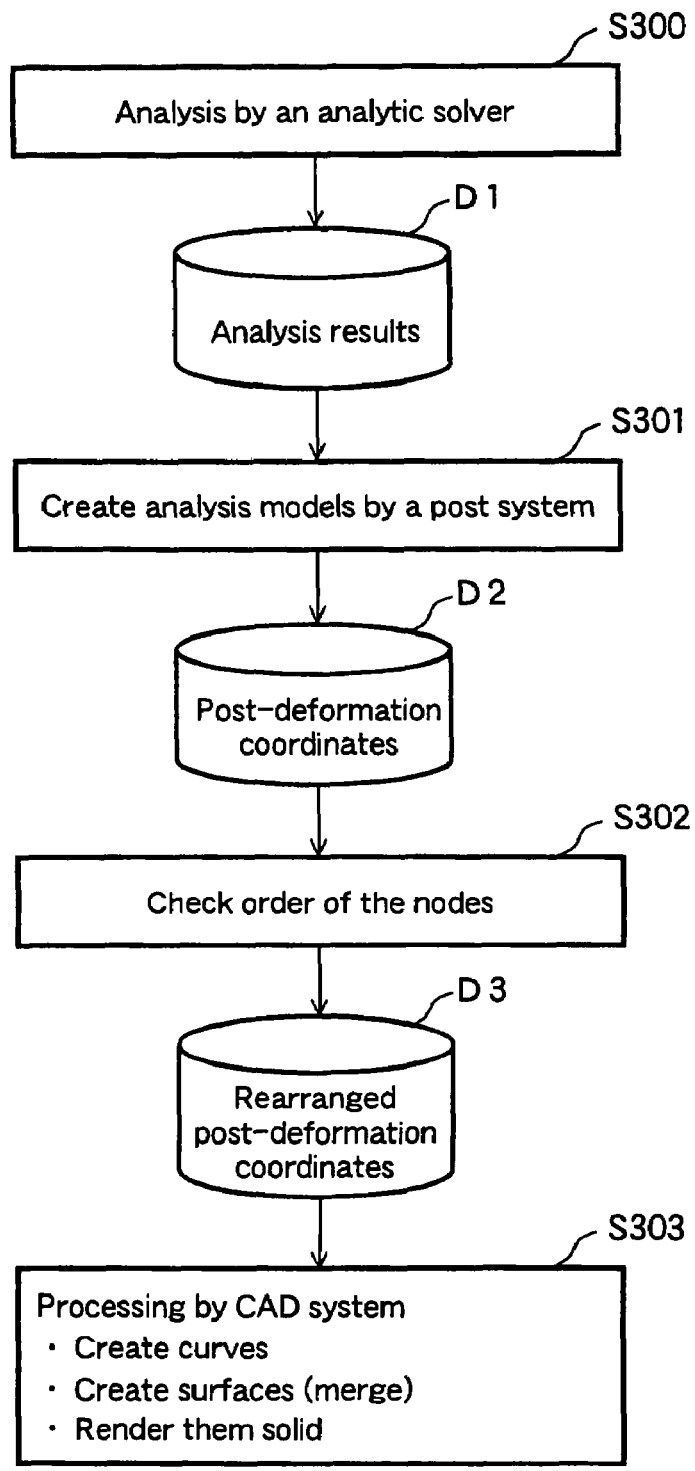
FIG. 18 is a flowchart showing a flow of a process of reading the analysis result data to CAD in the past.

FIG. 12 is a flowchart showing a flow of the boundary surface extraction process. Here, a search is made as to each surface constituting the elements to see whether or not it is the surface constituting the outside form, and in the case where the surface is determined to be the surface constituting the outside form as a result of the search, it is registered with the list as the boundary surface. Moreover, in this flowchart, it will be described by using Cell as a variable of the number of the elements and Face as a variable of the number of the element constituting surfaces. In addition, all the processing in this flowchart is performed by the boundary surface extracting portion 13.

First, 1 is set to the variable Cell as initialization (S200). In the case of Cell=1, the element <1> is a search subject element. Next, a loop I is rotated as often as the number of elements (S201 to S201'). As the total number of elements is 8 in this embodiment, the loop 1 ends when Cell exceeds 8.

Inside the loop 1, each surface constituting the elements is checked as to whether or not it is the boundary surface. First, 1 is set to a variable Face as initialization (S202). In the case of Face=1, a surface 1 of the element <1> is checked. Next, a loop 2 is rotated as often as the number of element constituting surfaces (S203 to S203'). As the elements is a hexahedron in this embodiment, the loop 2 ends when Face exceeds 6. In the case where the elements is a tetrahedron, upper limit of the loop is 4, and thus the upper limit is changeable according to the form of the component.

Inside the loop 2, it is checked whether or not Face 1 is shared with a surface constituting another element (S204). To be more specific, it is checked whether or not the node constituting the surface of a check subject element matches with the node constituting the surface of another element. In the case where it is determined to be shared (S204, yes), Face is incremented (S203') and a Face 2 is checked next. In the case where it is determined not to be shared (S204, no), applicable element number (element <1> in this case) and surface number (Face 1 in this case) are outputted to the CAD data generating portion 15. The CAD data generating portion 15 adds the outputted information to a boundary surface list (surface list) (S205).

The above processing is performed on each surface, and when Face exceeds 6, the loop 2 is finished and Cell is incremented by the loop 1, and the loop 2 is repeated as to the next element (element <2>). When the search is finished as to all the elements (when Cell exceeds 8), the boundary surface extraction process ends.

Hereafter, the processing in the case where the element <1> is the search subject in the boundary surface extraction process will be concretely described by using the drawings.

FIG. 13 is surface information on the element <1> composed according to an element definition rule. The surfaces 1 to 6 are comprised of constituting nodes 1 to 4 respectively. In addition, any item other than the subjects is flagged in the case where it is determined in S204 to be shared with the surface of another element.

First, the surface 1 of the search subject element <1> is checked as to whether or not there is a surface to be shared. In this case, it is determined that the surface is shared if all the numbers of the four points are matching irrespective of arrangement of the nodes constituting the surface. To begin with, it is checked in order from the surfaces of the element <2>. FIG. 14 is the surface information on the element <2> composed according to the element definition rule. As there is no surface on any surface of the element <2> having all the nodes thereof matching with those on the surface 1 of the element <1>, no item for the surface 1 other than its subjects is flagged at this stage. Likewise, constitutions of contacts are checked on all the surfaces of the elements <3> to <8>. Lastly, it is determined that the surface 1 is not shared with the surface constituting another element, and no item other than the subjects is flagged.

If FIG. 13 and FIG. 14 are compared, the data enclosed in a frame is matching, and so it is determined that the surface 4 of the element <1> is shared with the surface 6 of the element <2> so that the items other than the subjects are flagged. Thereafter, the surface 4 of the element <1> and the surface 6 of the element <2> are no longer the subjects of comparison. Likewise, if the element <1> is compared to the elements <3> to <6>, it is determined, as to the element <1>, that only three surfaces 1, 3 and 6 are not shared with other elements so as to be added to the surface list by the CAD data generating portion 15.

If the algorithm of boundary surface search is performed as to all the elements, the surface list shown in FIG. 15 is created. Next, The coordinate data obtaining portion 14 obtains the coordinates of the nodes constituting the boundary surface from the analysis result data obtained by the analysis result data obtaining portion 11 based on the surface list in FIG. 15 (FIG. 3, S102).

To be more specific, first, the data on the constituting nodes on the surface list in FIG. 15 is merged to eliminate overlapping nodes. In this case, only the node 14 of the model shown in FIG. 9 is eliminated so that it becomes "1, 2, 3, 4, 5, 6, 7, 8, 9, 10, 11, 12, 13, 15, 16, 17, 18, 19, 20, 21, 22, 23, 24, 25, 26, 27."

The coordinate values (post-deformation X coordinate, post-deformation Y coordinate, post-deformation Z coordinate) of these nodes are obtained from the analysis result data obtained by the analysis result data obtaining portion 11. The obtained coordinate data is outputted to the CAD data generating portion 15, and the CAD data generating portion 15 generates a coordinate value list according to the outputted data. FIG. 16 is a drawing showing a generated coordinate value list.

Thus, the CAD data generating portion 15 generates the surface list and coordinate value list in synergy with the boundary surface extracting portion 13 and the coordinate data obtaining portion 14. The CAD data generating portion 15 stores each list as the CAD data in the CAD database 16. Thereafter, it becomes possible, by using the stored CAD data, to expand the analysis model by the CAD by means of the conventionally existing CAD function (the CAD execution processing portion 17). The CAD execution processing portion 17 reads the coordinate value list from the CAD database 16, and newly creates the nodes for drawing the model after the deformation (S103). In this case, the node number on the analysis result data should match with the node number of the newly created node. Next, the surfaces are created in input order of nodes with the 4 points specified by referring to the surface list. To be more specific, the surfaces are created in order of input of the nodes (S104). Subsequently, all the surfaces are merged into one surface and rendered solid (S105).

Thus, the model before the deformation which was already displayed and the model after the deformation which is displayed by the above-mentioned process are displayed on a display 52 with the models superimposed.

While the CAD analysis result data processing apparatus is a part of the system provided to the CAD in the embodiment described above, it may also be an apparatus provided independently of the CAD. FIG. 17 is a diagram showing an overall block diagram in the case where the CAD analysis result data processing apparatus is provided independently of the CAD. As shown, a CAD analysis result data processing apparatus 1*a* is installed between a CAD 2*a* and an analytic apparatus 3*a* so as to operate. In addition, the CAD analysis result data processing apparatus may also be provided in the analytic apparatus though this case is not shown.

While various embodiments of the present invention were described as above, it is a matter of course that the present invention is not limited to the above-mentioned embodiments and is capable of application as far as it does not deviate from general description of the present invention.

As described in detail above, in the case of taking the analysis result data into the CAD according to the present invention, it is not necessary to master a high-level technique and it is possible to take the analysis results into the CAD just by simple specification of a command, compared to the cases of operating a surface-specific modeler or other dedicated software. In addition, the present invention can be provided as one function of a CAD system so that processing at a lower cost than the surface-specific modeler and so on is possible.

In addition, it does not take in all the node data but extracts only the nodes constituting the outside form of the model, so that the nodes inside the model unnecessary for CAD to represent the form can be cut and data capacity can be reduced. To be more specific, the processing time can be significantly reduced compared to the past technology for taking in all the node data.

In addition, according to the present invention, the coordinates of the surfaces constituting the outside form and the nodes constituting the surfaces are extracted as the CAD data at a stage before forming the surfaces of the analysis model, and so there is no need of complicated calculation when connecting the nodes and the surfaces can be formed just by simple comparison operation.

Furthermore, it is possible, as the basic coordinate systems of the analysis model and the CAD model are matching, to completely prevent a difference in reference positions when taking the analysis result data into the CAD. In addition, it has the effect of allowing the CAD model and the analysis result model to be displayed with the models superimposed.

What is claimed is:

1. A CAD analysis result data processing apparatus, comprising:
    an analysis result data obtaining part obtaining analysis result data of analytic simulation for dividing an object having a three-dimensional form into a plurality of elements, and performing an analysis of a predetermined physical quantity, with said analysis result data being obtained as electronic data, and with said analysis data result obtaining part converting and obtaining said analysis result data so that a basic coordinate system of the analytic simulation matches with a basic coordinate system of a CAD model;
    an extracting part extracting outside surfaces constituting an outside form of said object from surfaces of said plurality of elements based on the analysis result data obtained by said analysis result data obtaining part, with said outside surfaces constituting the outside form of said object being extracted as electronic data; and
    a coordinate obtaining part obtaining coordinates of said object after deformation by performing said analytic simulation for nodes included in the outside surfaces extracted by said extracting part based on the analysis result data obtained by said analysis result data obtaining part, with said coordinates of said object after deformation being obtained as electronic data, and outputting said coordinates of said object after deformation in a computer readable storage medium,
    wherein said analytic simulation is not performed for nodes inside the object.

2. The CAD analysis result data processing apparatus according to claim 1, wherein the analysis result data obtained by said analysis result data obtaining part includes coordinate information on the object after deformation by the analytic simulation.

3. The CAD analysis result data processing apparatus according to claim 1, wherein said extracting part has a shared surface determining part for determining a shared surface shared by the plurality of elements from the surfaces constituting said plurality of elements, and excludes the shared surface determined by the shared surface determining part from the surfaces constituting the outside form of the object so as to extract the surfaces constituting the outside form of the object.

4. The CAD analysis result data processing apparatus according to claim 3, wherein, in the case where the nodes constituting the surface of certain elements completely match with the nodes constituting the surface of other elements, said shared surface determining part determines that the surface constituted by the matching nodes is the shared surface.

5. The CAD analysis result data processing apparatus according to claim 1, wherein said coordinate obtaining part has an overlapping node eliminating part for eliminating overlapping of the nodes constituting the surfaces extracted by said extracting part, and obtains the coordinates of said object after deformation for the nodes after elimination by the overlapping node eliminating part.

6. The CAD analysis result data processing apparatus according to claim 1, wherein said apparatus has a CAD processing data generating part for generating as CAD processing data a list of the surfaces extracted by said extracting part and a coordinate list of the nodes obtained by said coordinate obtaining part.

7. A CAD system having a CAD analysis result data processing apparatus comprising:
    an analysis result data obtaining part for obtaining analysis result data of analytic simulation for dividing an object having a three-dimensional form into a plurality of elements and performing an analysis of a predetermined physical quantity, with said analysis result data being obtained as electronic data, and with said analysis data result obtaining part converting and obtaining said analysis result data so that a basic coordinate system of the analytic simulation matches with a basic coordinate system of a CAD model;
    an extracting part for, based on the analysis result data obtained by said analysis result data obtaining part, extracting surfaces constituting an outside form of said object from the surfaces constituting said plurality of elements, with said surfaces constituting the outside form of said object being extracted as electronic data;
    a coordinate obtaining part for, based on the analysis result data obtained by said analysis result data obtaining part, obtaining and outputting coordinates of said object after deformation by said analytic simulation for nodes constituting the surfaces extracted by said extracting part, with said coordinates of said object after deformation being obtained as electronic data;
    a CAD execution processing part for performing drawing or editing using the electronic data; and
    a CAD database storing CAD data necessary for processing in said CAD execution processing part on a computer readable storage medium.

8. An analytic simulation apparatus comprising:
    an analytic apparatus; and
    a CAD analysis result data processing apparatus having:
        an analysis result data obtaining part for obtaining analysis result data of analytic simulation for dividing an object having a three-dimensional form into a plurality of elements and performing an analysis of a predetermined physical quantity, with said analysis result data being obtained as electronic data, and with said analysis data result obtaining part converting and obtaining said analysis result data so that a basic coordinate system of the analytic simulation matches with a basic coordinate system of a CAD model;
        an extracting part for, based on the analysis result data obtained by said analysis result data obtaining part, extracting surfaces constituting an outside form of said object from the surfaces constituting said plurality of elements, with said surfaces constituting the outside form of said object being extracted as electronic data;

a coordinate obtaining part for, based on the analysis result data obtained by said analysis result data obtaining part, obtaining and outputting coordinates of said object after deformation by said analytic simulation for nodes constituting the surfaces extracted by said extracting part, with said coordinates of said object after deformation being obtained as electronic data;

a CAD execution processing part for performing drawing or editing using the electronic data; and a CAD database storing CAD data necessary for processing in said CAD execution processing part on a computer readable storage medium.

9. A CAD analysis result data processing method comprising:

a coordinate conversion operation of matching a basic coordinate system of the analytic simulation with a basic coordinate system of a CAD model;

a first operation of obtaining analysis result data of analytic simulation for dividing an object having a three-dimensional form into a plurality of elements and performing an analysis of a predetermined physical quantity;

a second operation of, based on the analysis result data obtained by said first operation, extracting surfaces constituting an outside form of said object from the surfaces constituting said plurality of elements; and a third operation of, based on the analysis result data obtained by said first operation, obtaining and outputting coordinates of said object after deformation by said analytic simulation for nodes located on the surfaces extracted by said second operation.

10. The CAD analysis result data processing method according to claim 9, wherein said second operation determines a shared surface shared by the plurality of elements from the surfaces constituting said plurality of elements, and excludes the shared surface from the surfaces constituting the outside form of the object so as to extract the surfaces constituting the outside form of the object.

11. A computer readable medium storing a CAD analysis result data processing program which when executed on a computer causes the computer to perform a process for obtaining CAD processing data from analysis result data, wherein said program causes the computer to execute:

a coordinate conversion operation of matching a basic coordinate system of an analytic simulation with a basic coordinate system of a CAD model;

a first operation of obtaining analysis result data of analytic simulation for dividing an object having a three-dimensional form into a plurality of elements and performing an analysis of a predetermined physical quantity;

a second operation of, based on the analysis result data obtained by said first operation, extracting surfaces constituting an outside form of said object from the surfaces constituting said plurality of elements; and a third operation of, based on the analysis result data obtained by said first operation, obtaining and outputting coordinates of said object after deformation by said analytic simulation for nodes constituting the surfaces extracted by said second operation.

12. The computer readable medium storing the CAD analysis result data processing program according to claim 11, wherein said second operation determines a shared surface shared by the plurality of elements from the surfaces constituting said plurality of elements, and excludes the shared surface from the surfaces constituting the outside form of the object so as to extract the surfaces constituting the outside form of the object.

13. The computer readable medium storing the CAD analysis result data processing program according to claim 11, wherein said first operation obtains the analysis result data, as to said object having the three-dimensional form, in the basic coordinate system of the analytic simulation, and converts the analysis result data in the basic coordinate system of the CAD model.

* * * * *